(12) United States Patent
Fujisawa et al.

(10) Patent No.: US 6,252,651 B1
(45) Date of Patent: Jun. 26, 2001

(54) EXPOSURE METHOD AND EXPOSURE APPARATUS USING IT

(75) Inventors: Tadahito Fujisawa, Tokyo; Satoshi Tanaka, Kawasaki; Akiko Mimotogi, Yokohama; Shoji Mimotogi, Yokohama; Soichi Inoue, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/437,259

(22) Filed: Nov. 10, 1999

Related U.S. Application Data

(62) Division of application No. 08/990,097, filed on Dec. 12, 1997, now Pat. No. 6,107,013.

(30) Foreign Application Priority Data

Dec. 16, 1996 (JP) ........................................ 8-335613
Sep. 9, 1997 (JP) .................................... 9-244023

(51) Int. Cl.⁷ ........................ G03B 27/42; G03B 27/54; G03B 27/72
(52) U.S. Cl. .................. 355/71; 355/53; 355/67
(58) Field of Search ................. 355/53, 67, 71, 355/77; 430/51, 20, 30, 494; 356/399–401

(56) References Cited

U.S. PATENT DOCUMENTS

| | | | |
|---|---|---|---|
| 4,737,022 | * | 4/1988 | Faltermeier et al. ............... 350/525 |
| 5,160,957 | * | 11/1992 | Ina et al. ............................. 355/43 |
| 5,231,471 | * | 7/1993 | Torigoe .............................. 356/401 |
| 5,278,012 | * | 1/1994 | Yamanaka et al. ................. 430/30 |
| 5,440,442 | | 8/1995 | Sandstrom ......................... 359/559 |
| 5,473,409 | | 12/1995 | Takeda et al. ...................... 355/53 |
| 5,538,833 | | 7/1996 | Ferguson et al. .................. 430/325 |
| 6,094,305 | * | 7/2000 | Shiraishi ............................. 359/558 |

FOREIGN PATENT DOCUMENTS

| | | | |
|---|---|---|---|
| 6-132194 | | 5/1994 | (JP) . |
| 6-132194A | * | 5/1994 | (JP) ................................... 359/896 |
| 8-64523 | | 3/1996 | (JP) . |

* cited by examiner

Primary Examiner—Russell Adams
Assistant Examiner—Hung Henry Nguyen
(74) Attorney, Agent, or Firm—Finnegan, Henderson, Farabow, Garrett & Dunner, L.L.P.

(57) ABSTRACT

An exposure method includes the phase-shifting mask supply step, the phase-shifting mask being prepared by selectively forming a light-shielding portion and a phase shifter on a substrate, and the resist exposure step of performing both exposure of a resist by dark field illumination light and exposure of the resist by bright field illumination light by using the phase-shifting mask, thereby removing residual resist generated by the influence of the edge of the phase shifter.

9 Claims, 14 Drawing Sheets

EXPOSURE METHOD AND EXPOSURE APPARATUS USING IT

This is a division of application Ser. No. 08/990,097, filed Dec. 12, 1997 now U.S. Pat. No. 6,107,013, all of which are incorporated herein by reference.

BACKGROUND OF THE INVENTION

The present invention relates to a lithography technique for manufacturing a semiconductor and, more particularly, to an exposure method using a phase-shifting mask (PSM) and an exposure apparatus using the exposure method.

In a pattern formation method of transferring a pattern drawn on a mask to a wafer by using lithography, the pattern to be transferred must be fine and sharp. As one technique for meeting this demand, various phase-shifting masks are proposed. As a typical one, a alternating phase-shifting mask formed by setting on phase difference of 180° between two adjacent transparent portions is well known.

When, however, a mask (bright field mask) having a transparent peripheral portion in a main pattern is used as an alternating phase-shifting mask, if exposure light is irradiated on this mask, a dark portion is formed at the shifter edge of the pattern end portion. As a result, part of a resist corresponding to the shifter edge is undesirably left without being exposed. Therefore, when a fine pattern or the like is to be formed using an alternating phase-shifting mask, the mask must be elaborated to prevent generation of any unwanted residual resist.

BRIEF SUMMARY OF THE INVENTION

It is, therefore, an object of the present invention to provide an exposure method and apparatus in which generation of residual resist by formation of a dark portion at a shifter edge can be suppressed without complicating the mask structure or requiring any multiple exposure process or the like, and the exposure margin such as the exposure energy tolerance and the focal depth can be increased.

To solve the above problems, according to the first aspect of the present invention, there is provided an exposure method comprising the phase-shifting mask supply step, the phase-shifting mask being prepared by selectively forming a light-shielding portion and a phase shifter on a substrate, and the resist exposure step of performing both exposure of a resist by dark field illumination light and exposure of the resist by bright field illumination light by using the phase-shifting mask, thereby removing residual resist generated by influence of an edge of the phase shifter.

The resist exposure step preferably comprises controlling an exposure energy ratio of exposure by dark field illumination to exposure by bright field illumination to be substantially 3 to 5. It is important to control the exposure ratio so as to obtain sharp contrast between an image at a portion corresponding to the light-shielding portion and an image at a portion corresponding to the edge of the phase shifter.

The resist exposure step comprises the step of splitting illumination light emitted by an illumination light source into bright and dark field illumination light components by using a beam-splitting mechanism. With this step, exposure by bright field illumination and exposure by dark field illumination can be performed with a single illumination light source.

The beam-splitting mechanism is preferably a grating, and 0th-order and 1st-order diffracted light components obtained by the grating can be respectively used as the bright and dark field illumination light components to realize dark field illumination and bright field illumination with a single light source.

The beam-splitting mechanism may split the illumination light emitted by the illumination light source into the bright and dark field illumination light components by using an optical element having a first optical portion for directing incident illumination light to a direction to serve as dark field illumination, and a second optical portion for directing the incident illumination light to a direction to serve as bright field illumination. In this case, an intensity ratio of the dark field illumination light component to the bright field illumination light component can be controlled by controlling a ratio of a projection area of an incident surface of the first optical portion of the beam-splitting mechanism in an incident direction to a projection area of an incident surface of the second optical portion in the incident direction.

According to the second aspect of the present invention, there is provided an exposure apparatus comprising a phase-shifting mask prepared by selectively forming a light-shielding portion and a phase shifter portion on a substrate, a phase-shifting mask holding mechanism, an exposure optical system for performing both exposure of a resist by dark field illumination light and exposure of the resist by bright field illumination light by using the phase-shifting mask, and exposure control means for controlling exposure energy by the dark field illumination light and exposure energy by the bright field illumination light to remove residual resist generated by influence of an edge of the phase shifter.

By applying the method of the first aspect to this apparatus, residual resist generated by the influence of the edge of the phase shifter can be removed, and satisfactory exposure can be performed.

According to the third aspect of the present invention, there is provided a phase-shifting mask capable of removing residual resist generated by the influence of the edge of the phase shifter. The phase-shifting mask is prepared by integrally arranging the beam-splitting mechanism on the illumination light source side of the substrate on which the light-shielding portion and the phase shifter are selectively formed.

With this arrangement, exposure by dark field illumination and bright field illumination can be realized by a single light source without using a special exposure apparatus, thereby removing any unwanted residual resist.

Additional object and advantages of the invention will be set forth in the description that follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be described in detail below with reference to the several views of the accompanying drawing.

(First Embodiment)

The first embodiment of the present invention will be described with reference to FIGS. 1 to 7.

The first embodiment will exemplify the case wherein the present invention is applied to formation of a 0.2-$\mu$m gate pattern. As an arrangement capable of exposure by dark field illumination, the first embodiment employs the same arrangement as that of, e.g., a projection exposure apparatus disclosed in Jpn. Pat. Appln. KOKAI Publication No. 6-132194. The arrangement of this exposure apparatus will be explained below with reference to FIG. 1.

Figure 1:
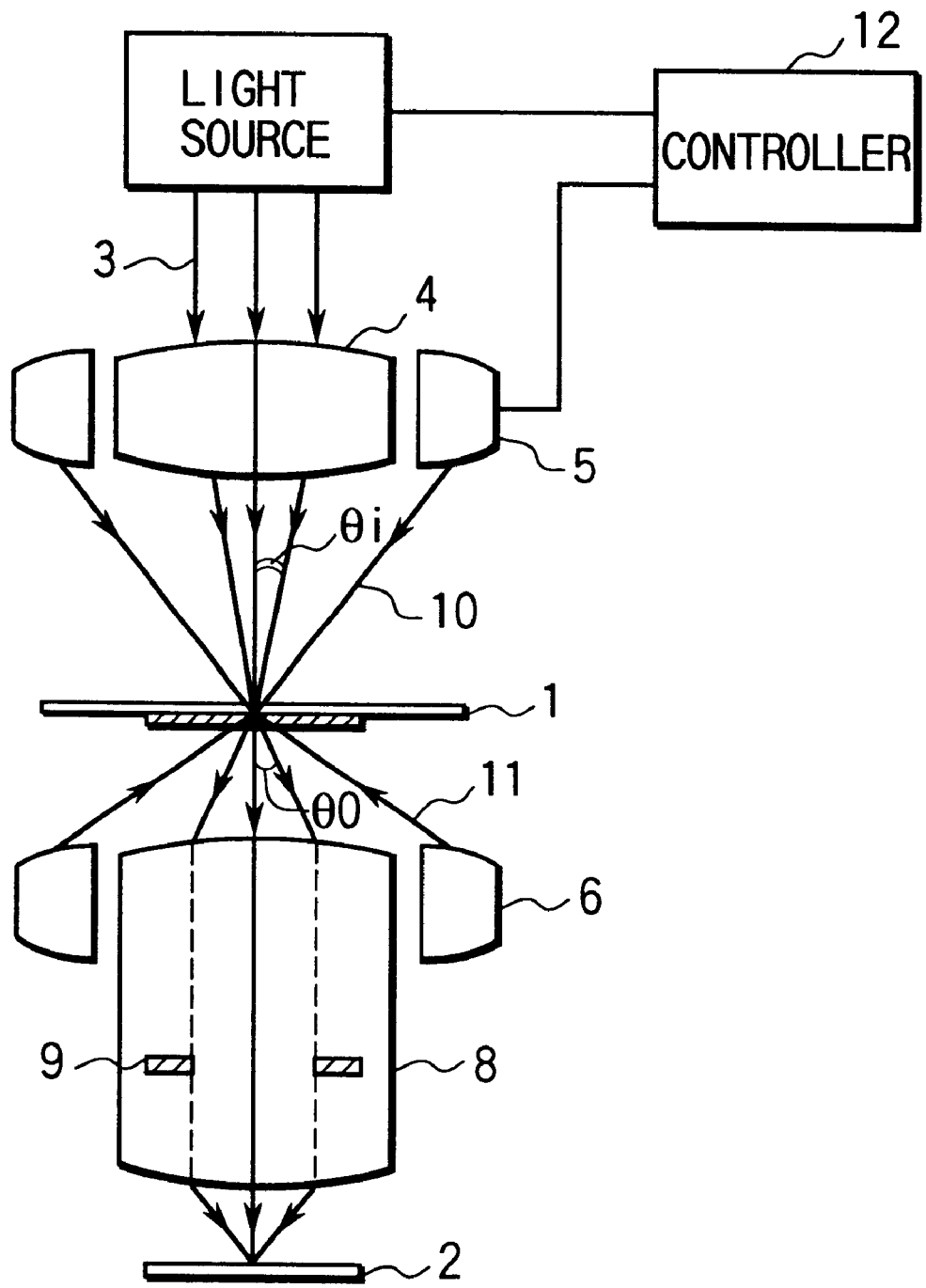
FIG. 1 is a view showing an example of the arrangement of a projection exposure apparatus or projection aligner used in the first embodiment of the present invention.

This apparatus has a function of exposing a resist (not shown) applied on a wafer 2 by using a mask shown in FIG. 1. Reference numeral 3 in FIG. 1 denotes illumination light emitted by a light source (not shown). The illumination light 3 enters a bright field illumination system 4. The bright field illumination system 4 is constituted by a field stop, a fly array lens, a selector aperture, a condenser lens, and the like.

The exposure apparatus comprises dark field illumination systems 5 and 6. The dark field illumination system 5 is of a transmission type, and illuminates a mask 1 from the same side as that of the bright field illumination system 4. The dark field illumination system 6 is an incident-light illumination system, and illuminates the mask 1 from the back side.

The exposure apparatus has a projection optical system 8 for projecting the circuit pattern of the mask 1 onto the wafer 2.

In this case, bright field illumination is an illumination system in which all the illumination light 3 transmitted through the mask 1 passes through a pupil 9 of the projection optical system 8 to uniformly illuminate the wafer (specimen) 2 when the mask 1 does not have any circuit pattern. Dark field illumination is an illumination system in which illumination light components 10 and 11 passing through the mask 1 have inclinations larger than the NA of the projection optical system 8, so they neither pass through the pupil 9 nor reach the wafer 2 when the mask 1 does not have any circuit pattern.

In dark field illumination, when a circuit pattern is set on the mask 1, part of diffracted light passing through the circuit pattern forms an image on the wafer 2 via the projection optical system 8. By this dark field illumination, the image of the shifter-edge portion formed as a dark portion by bright field illumination is formed as a bright portion. A coherence factor $\sigma$ of exposure by bright field illumination falls within the range $0<\sigma<1$, and that by dark field illumination $\sigma>1$.

Figure 2A:
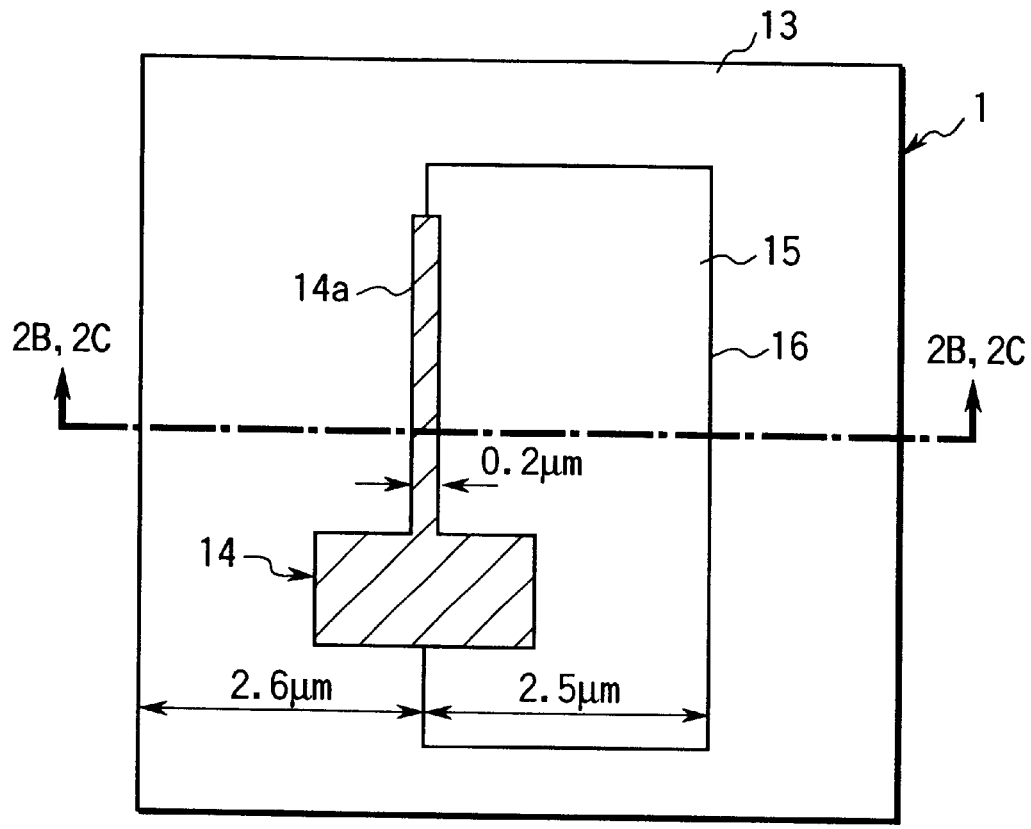
FIGS. 2A to 2C are views, respectively, showing the schematic arrangement of a phase-shifting mask used in the first embodiment.
Figure 2B:
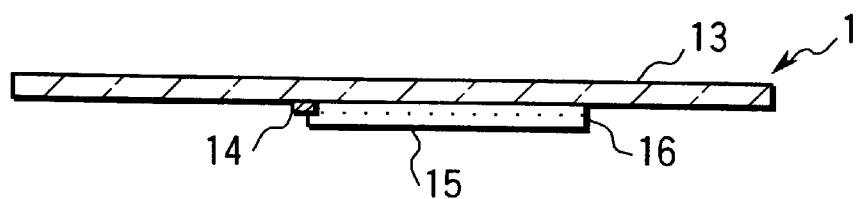

FIGS. 2A and 2B show the mask 1 used in the first embodiment.

The mask 1 is a phase-shifting mask prepared by forming a 0.2-$\mu$m gate pattern. FIG. 2A is a plan view of the mask 1, and FIG. 2B shows a sectional structure taken along the line 2B—2B in FIG. 2A. The mask 1 will be referred to as a phase-shifting mask hereinafter.

The phase-shifting mask 1 has a transparent substrate 13. A main pattern 14 made up of a fine-line gate pattern portion 14a and a contact pattern portion 14b is formed of a light-shielding member on the transparent substrate 13. A phase shifter 15 is also formed on the transparent substrate 13 while partially overlapping the main pattern 14. The transparent substrate 13 is made of silica, the light-shielding member (main pattern 14) Cr, and the phase shifter 15 $SiO_2$. Reference numeral 16 in FIG. 2A denotes an edge of the phase shifter 15.

Figure 2C:
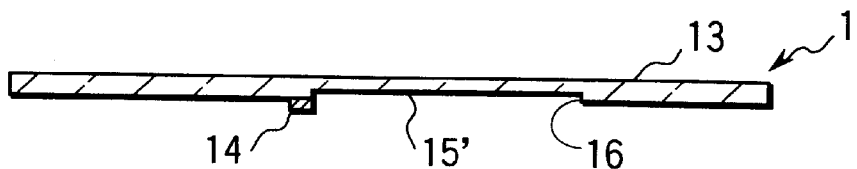

The mask 1 may have a structure in which a phase shifter 15' is formed by etching the substrate 13, as shown in FIG. 2C, other than the structure in FIG. 2B.

In the first embodiment, the exposure apparatus has a controller 12 capable of controlling the exposure energy by bright field illumination and the exposure energy by dark field illumination in addition to the exposure conditions.

Bright field illumination with the exposure wavelength=248 nm, NA=0.5, and σ=0.3, and zone plate dark field illumination with a=1.5 and the shielding ratio=0.75 are simultaneously performed, and their illumination intensity ratio {(ammular illumination intensity with σ=1.5 and the shielding ratio=0.75)/(normal illumination intensity with σ=0.3)} is set at 5. As a resist formed on the wafer 2, a positive chemically amplified resist is used.

Figure 3C:
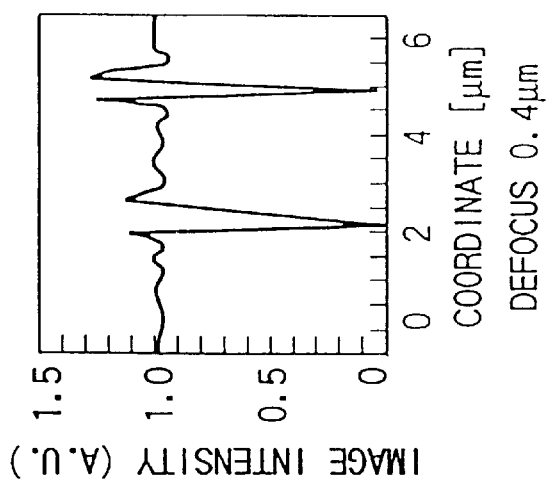
FIGS. 3A to 3E are graphs, respectively, showing, of the image intensity distributions on a section 2B–2B in FIG. 2A, those by bright field illumination.
Figure 3B:
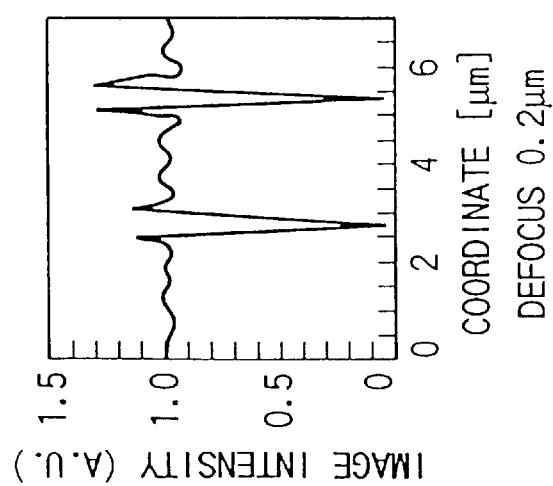
Figure 3A:
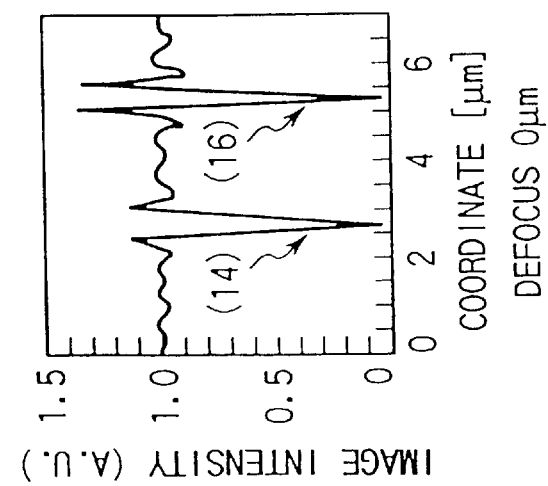
Figures 3D, 3E:
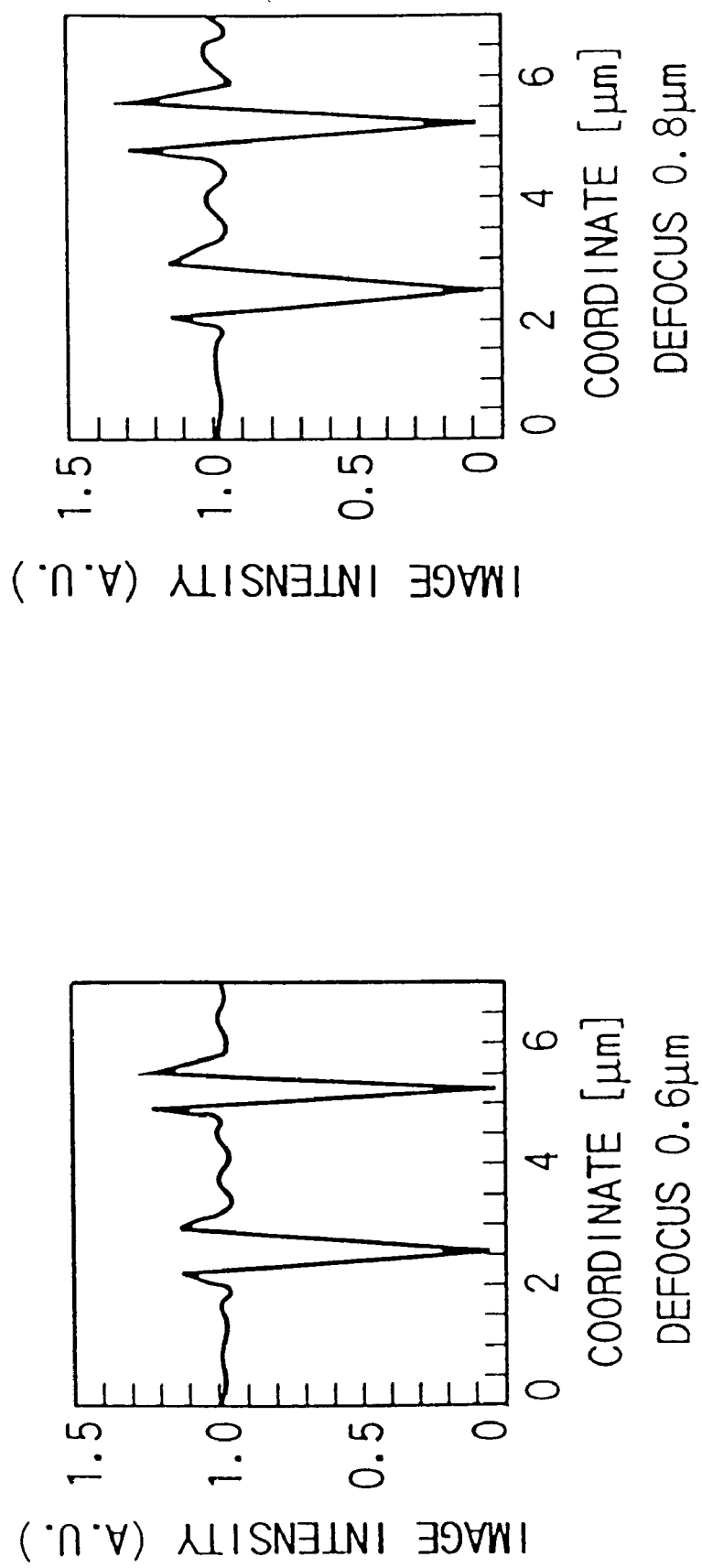

FIGS. 3A to 3E respectively show image intensity distributions at a portion along the section 2B—2B in FIG. 2A obtained when only bright field illumination with σ=0.3 is used. FIG. 3A shows an intensity distribution obtained under in-focus conditions, and FIGS. 3B, 3C, 3D, and 3E show intensity distributions for defocuses of 0.2 μm, 0.4 μm, 0.6 μm, and 0.8 μm, respectively.

In FIG. 3A, a portion (14) is a dark portion generated in correspondence with the gate pattern portion 14a of the main pattern 14 in FIG. 2, and a portion (16) is a dark portion generated in correspondence with the edge 16 in FIG. 2. In FIGS. 3B to 3E, reference numerals are not illustrated.

Figure 4:
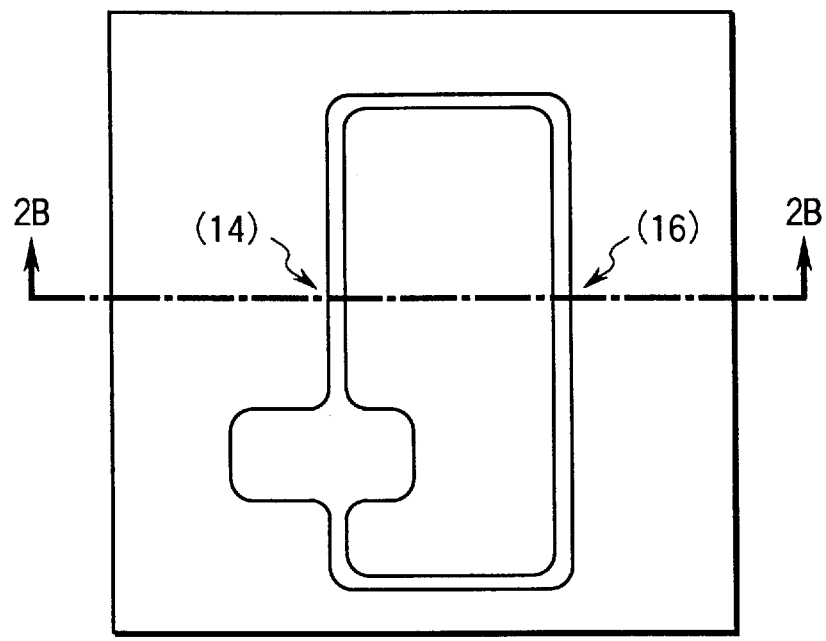
FIG. 4 is a contour diagram showing variations in resist pattern dimension when the exposure energy is varied in bright field illumination within a predetermined range centered on exposure energy for resolving a gate pattern portion with a desired dimension.

FIG. 4 is a contour diagram showing variations in exposure dimension when the exposure energy is varied within the range of −20% to +20% (10% increments) centered on exposure energy for resolving the gate pattern portion 14a with a desired size of 0.2 μm. In FIG. 4, although there are actually 5 lines, they appear to be one line because the image is sharp.

As is apparent from FIGS. 3A to 3E and FIG. 4, by normal exposure with only a σ<1 (bright field illumination), a dark portion is formed at the portion (16) corresponding to the shifter edge 16 in addition to the portion (14) corresponding to the main pattern 14. This forms an unwanted resist pattern (residual resist) at a portion (portion corresponding to the shifter edge 16) except for a portion corresponding to the main pattern.

The present inventors noted the fact that dark field illumination emphasizes the shifter edge 16 to form a bright portion, unlike bright field illumination, and established that the residual resist otherwise formed in correspondence with the shifter edge 16 can be removed by adding exposure using dark field illumination to exposure by bright field illumination with σ<1.

In dark field illumination, a decrease in exposure margin (exposure energy tolerance and focal depth) for the main pattern 14 (light-shielding member) formed of a component with a relatively low spatial frequency can be suppressed though a steep edge 16 is influenced.

FIGS. 5A to 5E respectively show, of the image intensity distributions on the section 2B—2B in FIG. 2A, distributions by zone plate dark field illumination with σ=1.5 and the shielding ratio=0.75. The defocus conditions in FIGS. 5A to 5E are the same as those in FIGS. 3A to 3E. As shown in FIGS. 5A to 5E, the image intensity of a component (16') corresponding to the shifter edge 16 is higher than that of a component (14') corresponding to the main pattern 14 (light-shielding member). Apparently, the dark field illumination has emphasized the shifter edge 16.

As indicated by reference numeral (16') in FIGS. 5A to 5E, the lightness of the shifter edge 16 is decreased by the defocus. Therefore, to satisfactorily remove the residual resist, the illumination intensity ratio or exposure energy ratio must be adjusted in accordance with the necessary focal depth and exposure energy tolerance.

FIGS. 6A to 6E respectively show the image intensity distributions on the section 2B—2B in FIG. 2A obtained when exposure is performed in the application of the present invention, i.e., when exposure using both bright field illumination and dark field illumination is performed. The defocus conditions in FIGS. 6A to 6E are the same as those in FIGS. 3A to 3E and FIGS. 5A to 5E. Reference numerals (14") and (16") in FIG. 6A denote components corresponding to the main pattern 14 and the shifter edge 16, respectively.

As is apparent from FIGS. 6A to 6E, by performing exposure using both bright field illumination and dark field illumination, as in the first embodiment, the residual resist can be effectively removed because the shifter edge 16 which forms a dark portion in bright field illumination forms a bright portion in dark field illumination. As already pointed out, however, the effect of dark field exposure decreases to form a dark portion as the defocus increases.

Figure 7:
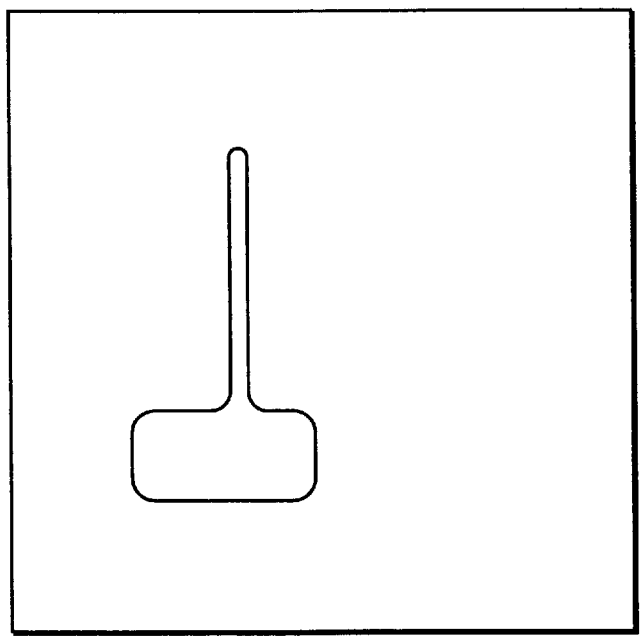
FIG. 7 is a contour diagram showing variations in resist pattern dimension when both bright field illumination and dark field illumination are performed, and the exposure energy is varied within a predetermined range centered on exposure energy for resolving the gate pattern portion with a desired dimension.
Figure 5C:
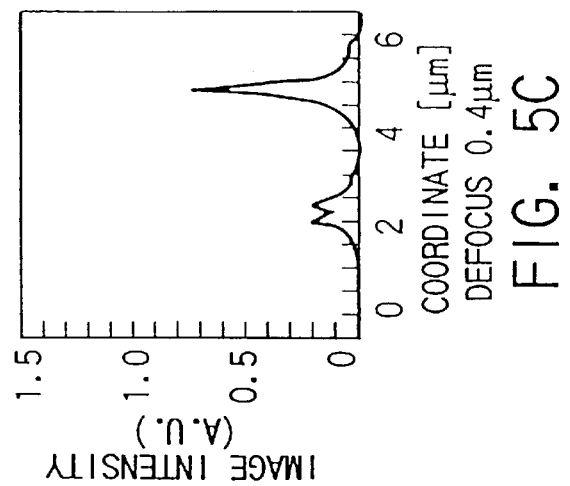
FIGS. 5A to 5E are graphs, respectively, showing, of the image intensity distributions on the section 2B–2B in FIG. 2A, those by dark field illumination.
Figure 5B:
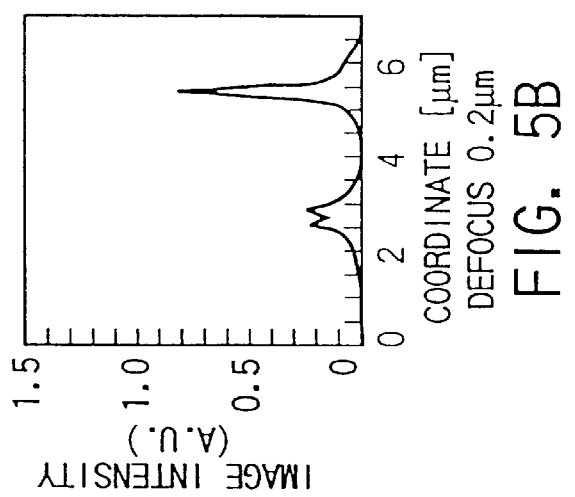
Figure 5A:
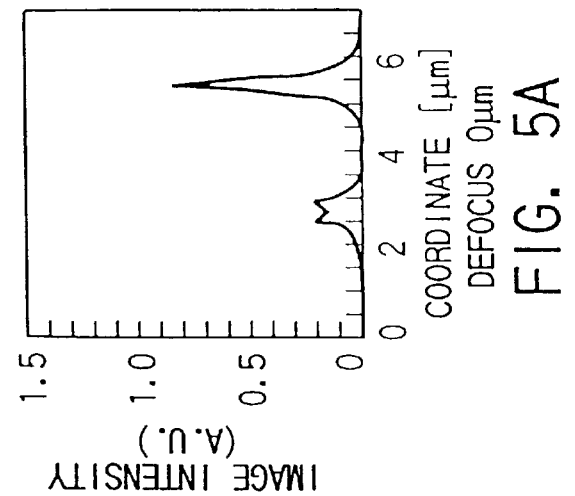
Figure 5E:
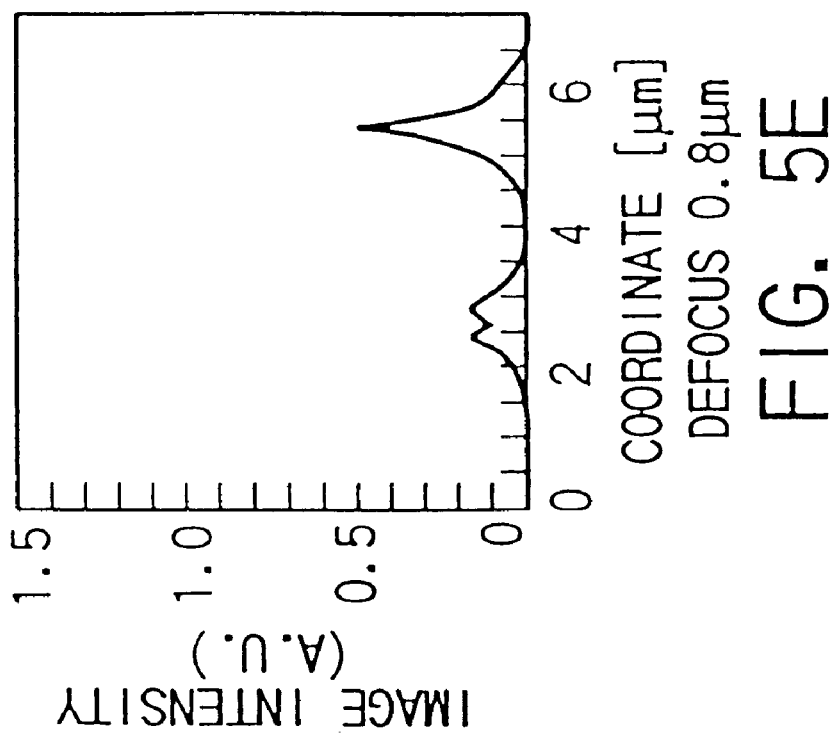
Figure 5D:
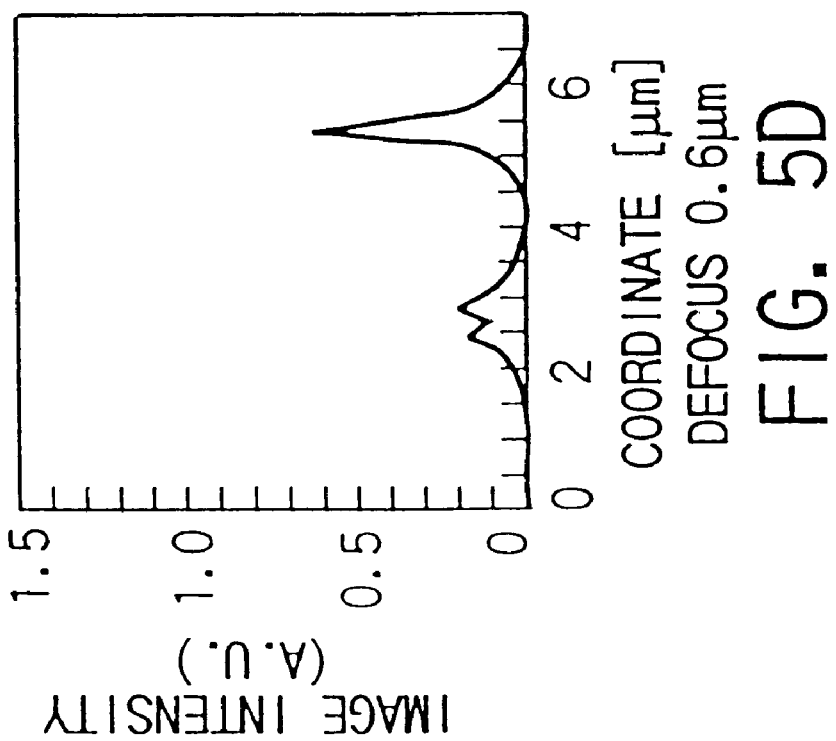
Figure 6C:
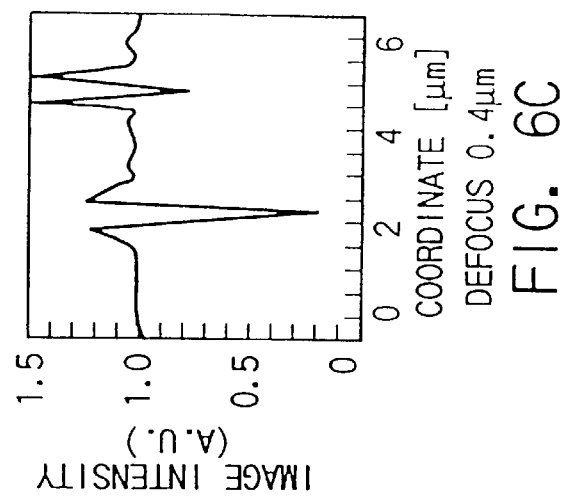
FIGS. 6A to 6E are graphs, respectively, showing image intensity distributions obtained on the section 2B–2B in FIG. 2A when both bright field illumination and dark field illumination are performed.
Figure 6B:
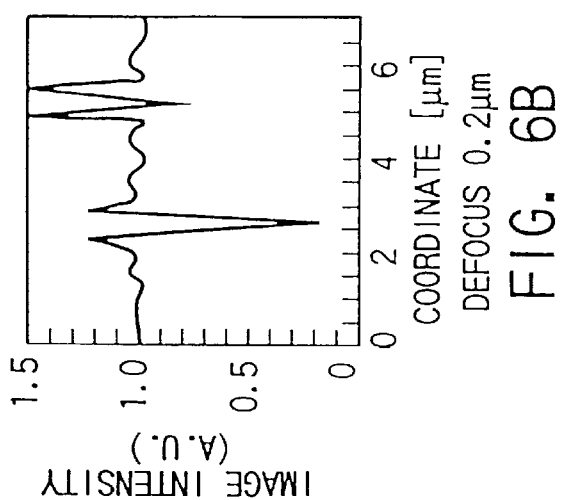
Figure 6A:
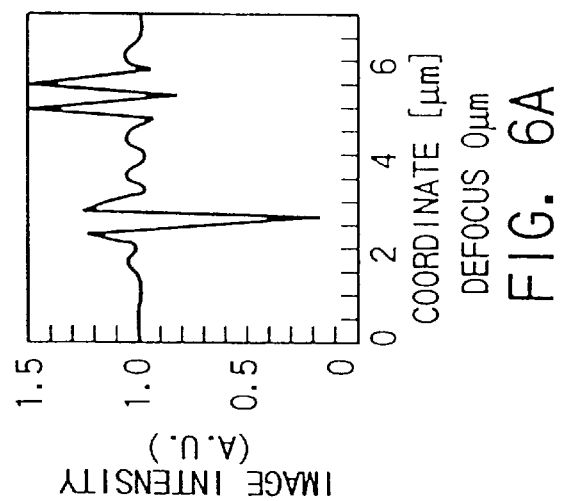
Figure 6E:
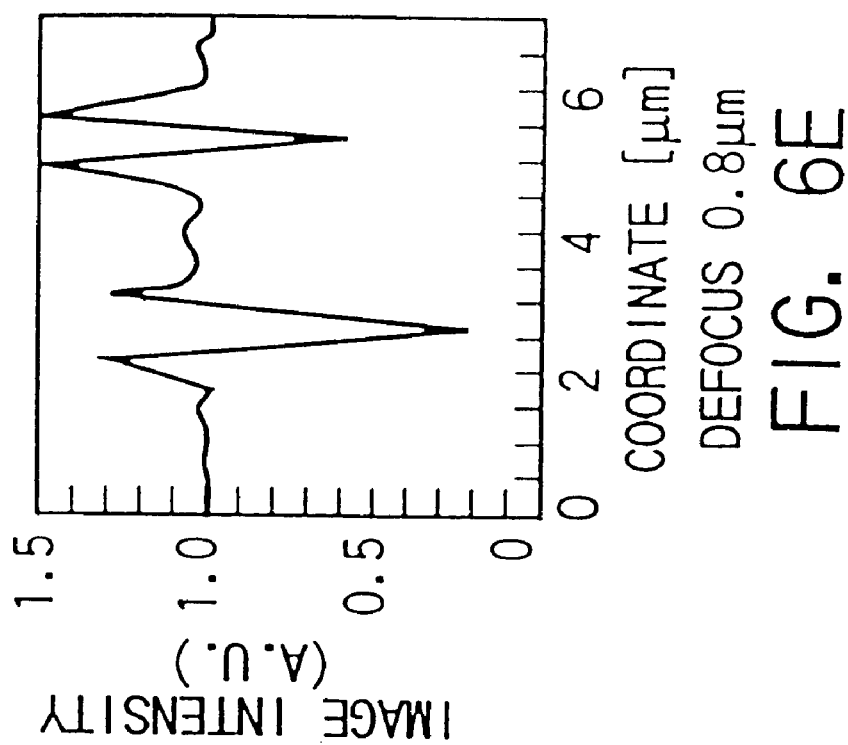
Figure 6D:
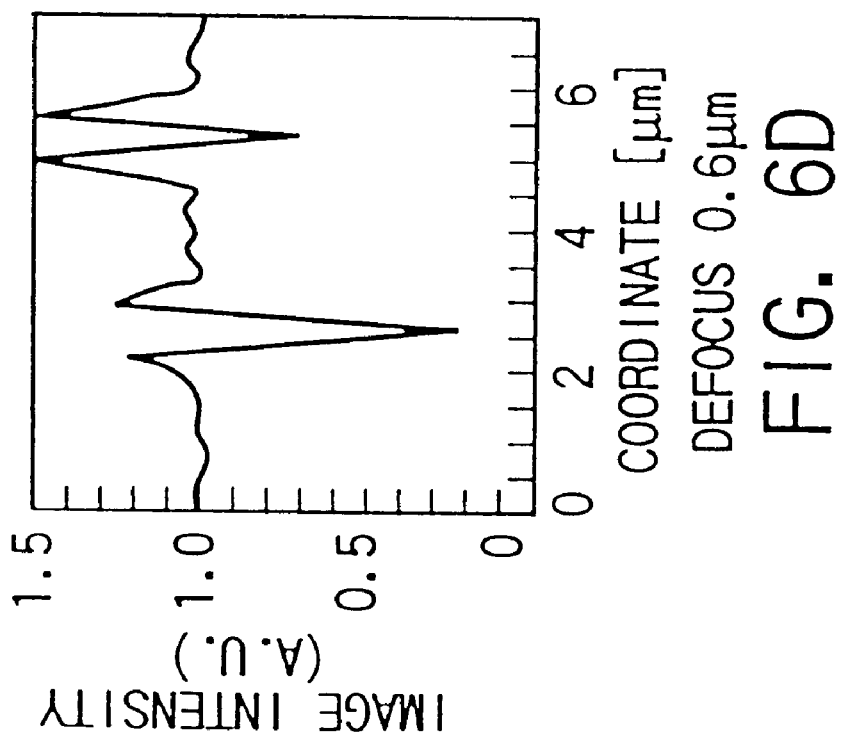

FIG. 7 shows the exposure result obtained in the use of both bright field illumination and dark field illumination. Similar to FIG. 4, FIG. 7 is a contour diagram showing variations in exposure dimension when the exposure energy is varied within the range of −20% to +20% (10% increments) centered on exposure energy for resolving the gate pattern portion 14a with a desired size of 0.2 μm. Also in FIG. 7, although there are actually 5 lines, they are seen to be one line because an image is sharp. According to the first embodiment, residual resist generated in correspondence with the shifter edge 16 can be removed, and a desired 0.2-μm gate pattern can be formed with a high exposure energy tolerance.

In the exposure conditions of the first embodiment, zone plate dark field illumination is used. However, the exposure conditions are not limited to the zone plate dark field illumination, and the same effect can be obtained as far as the conditions include dark field illumination with σ>1.

(Second Embodiment)

The second embodiment will be described below.

In the second embodiment, a positive bias is applied to a main pattern 14, and the intensity ratio of dark field illumination with σ>1 to normal illumination with σ<1 is adjusted in accordance with the positive bias to enhance the residual resist removal effect and greatly increase the exposure margin.

A mask 1 used in the second embodiment may have substantially the same structure as in the first embodiment. In the second embodiment, a desired dimension of a pattern formed on a wafer 2 by a gate pattern portion 14a of the main pattern 14 is 0.15 μm.

Similar to the first embodiment, exposure is performed by bright field illumination with the exposure wavelength=243 nm, NA=0.5, and σ=0.3 and zone plate dark field illumination with σ=1.5 and the shielding ratio=0.75 using an apparatus capable of setting both a σ<1 and σ>1 as an exposure apparatus under the same conditions as those in the first embodiment. The resist used is a positive chemically amplified resist.

In the second embodiment, to increase the exposure margin for an isolated pattern having a width of 0.15 μm as a desired pattern, a positive bias is applied to the main pattern 14 (light-shielding portion) (the width is increased), and the ratio of the two illumination intensities, {(ammular illumination intensity with σ=1.5 and shielding ratio=0.75)/ (normal illumination intensity with σ=0.3)}, is optimized.

Figure 8:
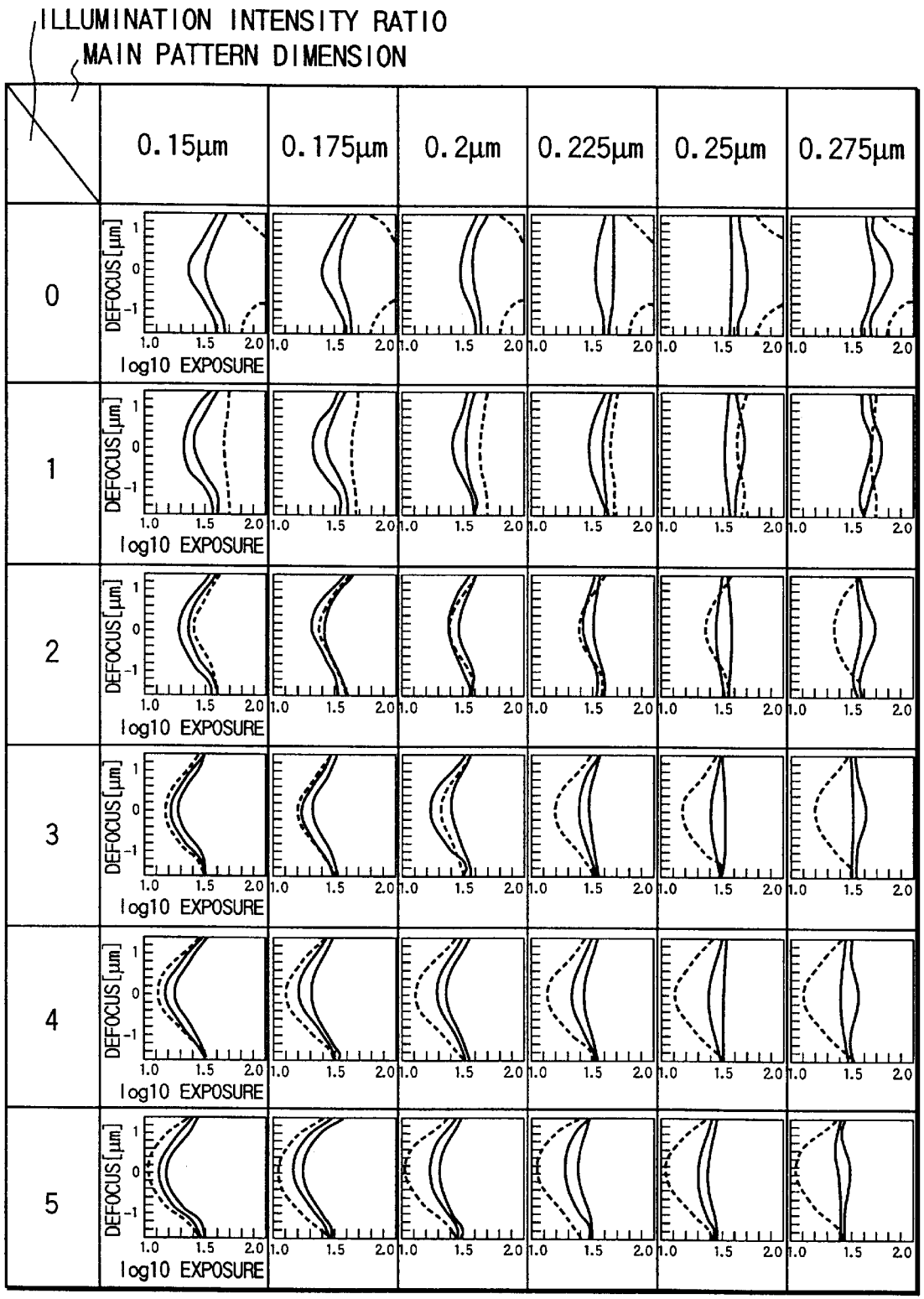
FIG. 8 is a table showing the influence on the dimension of a resist formed by the illumination intensity ratio and the difference in main pattern dimension by using an ED-Tree in the second embodiment.

FIG. 8 shows the influence on the dimension of a resist formed of the illumination intensity ratio and the difference in main pattern dimension by using an ED-Tree. The solid line in FIG. 8 represents the relationship between the exposure energy required to form a main pattern with a desired dimension ±10% and the defocus, and the dotted line represents the boundary of formation of residual resist. On the larger-exposure energy side of the boundary of the dotted line, the residual resist can be removed.

The resist line width by the resist process was calculated by the method described in the reference (S. Mimotogi and Inoue, "Enhanced Greeneich Model for Faster and Accurate Development Simulation", Digest of Papers Microlithography '95, 35, 1995).

Figure 9:
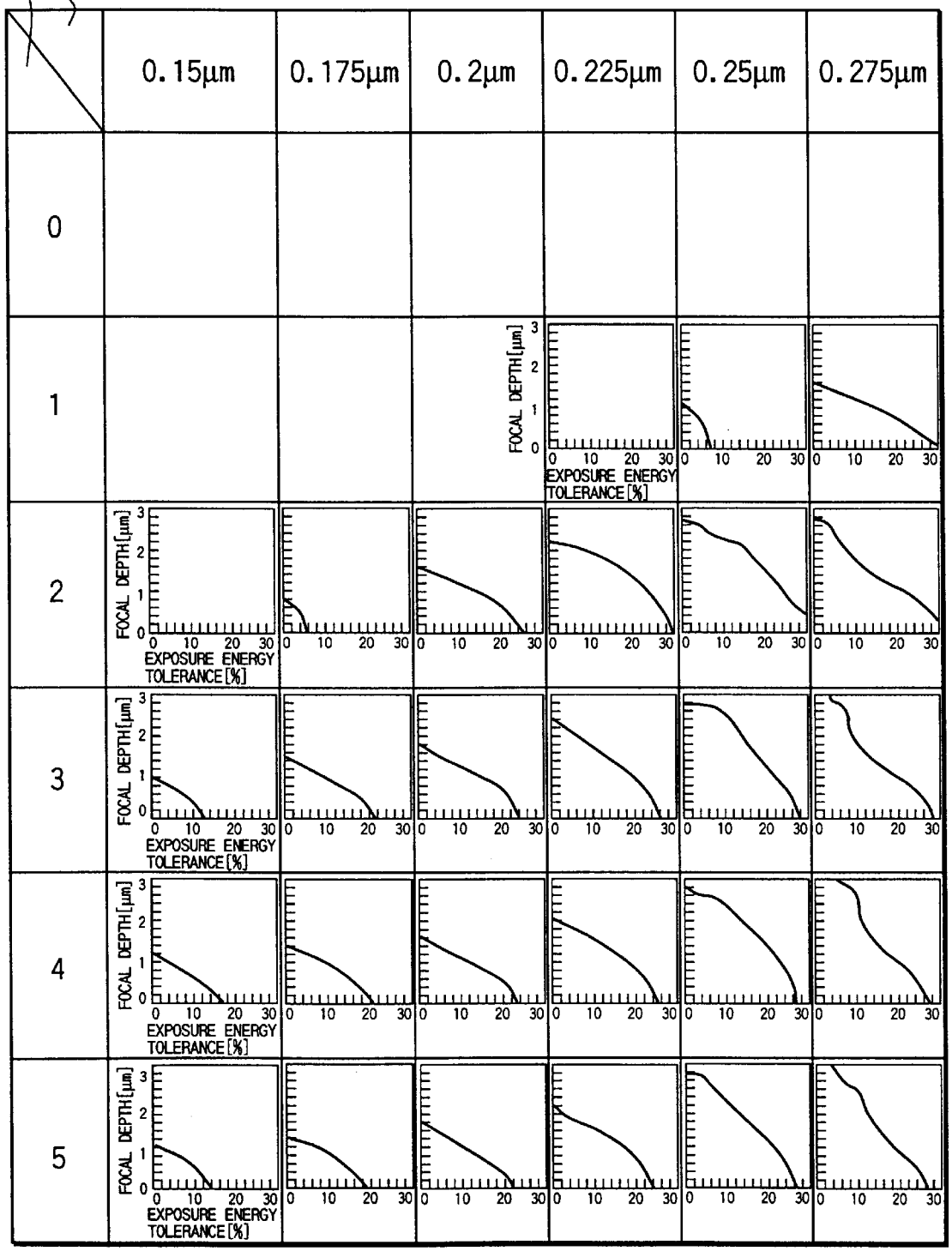
FIG. 9 is a table showing the illumination intensity ratio and bias dependence of the exposure margin (focal depth and exposure energy tolerance) obtained from FIG. 8.

FIG. 9 shows the illumination intensity ratio and bias dependence of the exposure margin (focal depth and exposure energy tolerance) obtained from FIG. 8. As is apparent from FIGS. 8 and 9, from the ED-Tree shape depending on the dimension of the main pattern 14 in FIGS. 8 and 9, as a positive bias is applied to increase the width of the main pattern 14 (gate pattern portion 14a), the exposure energy tolerance increases, and the inclination of the ED-Tree becomes steeper to greatly improve the focal depth. This is because the contrast between the main pattern 14 and a shifter edge 16 can be emphasized by applying a positive bias to the main pattern 14.

The bias amount for the main pattern (the increase amount of the pattern width) is therefore set in consideration of limitations on pattern layout, a necessary exposure margin, and the influence of a residual resist film or the like with an increase in proper exposure though this influence is not considered in FIG. 8. As for the illumination intensity ratio, as the intensity ratio increases, the contrast between the main pattern 14 and the shifter edge 16 is emphasized to suppress generation of the residual resist. It should be noted that an excessive increase in illumination intensity ratio decreases the exposure margin because a bright portion is formed by dark field illumination in correspondence with the edge of the main pattern, which is not so prominent as the shifter edge.

Considering the above two factors, the illumination intensity ratio for obtaining a proper exposure margin is set in accordance with the main pattern dimension (bias amount) on the basis of FIG. 9. An optimal illumination intensity ratio tends to decrease as the main pattern dimension increases (positive bias increases).

Figure 10A:
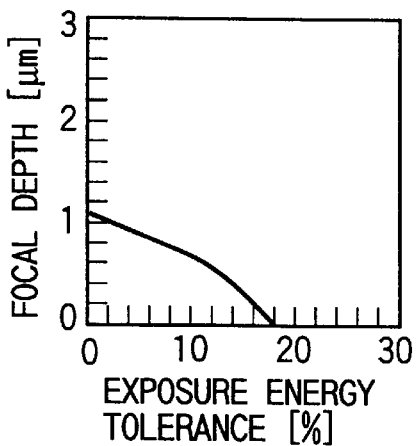
FIGS. 10A and 10B are graphs, respectively, showing the exposure margin when an attenuated mask having a transmittance of 6% and a normal binary mask are used.
Figure 10B:
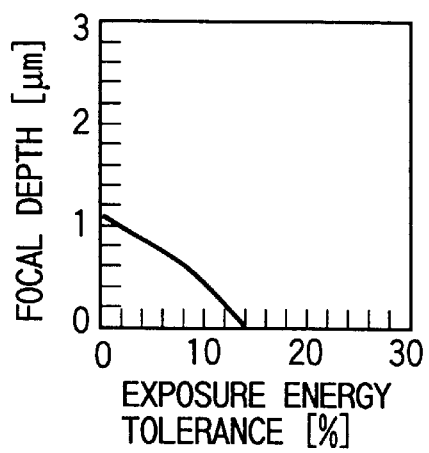

FIGS. 10A and 10B respectively show the exposure margin when an attenuated mask having a transmittance of 6% and a normal binary mask are used for comparison. The optical conditions in FIGS. 10A and 10B are normal ammular illumination, the exposure wavelength=248 nm, NA=0.5, σ=0.75, and the shielding ratio=0.67. From a comparison between FIG. 9 and FIGS. 10A and 10B, the illumination intensity ratio suffices to be 3 to 5 when a range wherein the exposure margin becomes larger than that using the attenuated mask and that using the binary mask is selected from the whole main pattern dimension range of 0.15 μm to 0.275 μm. Note that the illumination intensity ratio can be further decreased depending on the bias amount for the main pattern 14.

According to the second embodiment, if a positive bias is applied to the main pattern 14 in consideration of the pattern layout, the influence of a residual resist film, a necessary exposure margin, and the like, and the illumination intensity ratio is set in accordance with the bias amount, generation of residual resist corresponding to the shifter edge 16 can be suppressed. In addition, the exposure margin for the main pattern can be greatly increased.

Although the intensity ratio of dark field illumination to bright field illumination is set to 3 to 5, the same effect can be obtained even by setting the exposure time ratio to 3 to 5.

(Third Embodiment)

Figure 11:
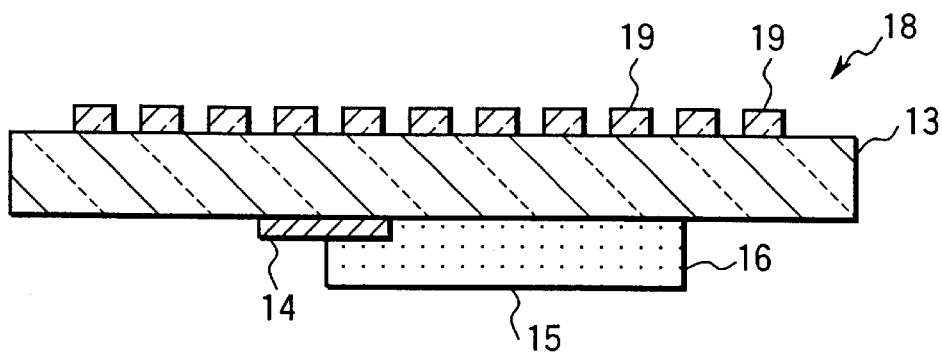
FIG. 11 is a view showing the sectional structure of an mask used in the third embodiment.

FIG. 11 is a view showing the sectional structure of an mask 18 used in the third embodiment of the present invention.

In the first and second embodiments, the exposure apparatus having both the bright and dark field illumination systems is employed. In the third embodiment, the mask 18 itself has a function (beam-splitting mechanism) capable of exposure by bright field illumination and dark field illumination. The same reference numerals as in the first embodiment (FIGS. 2A and 2B) denote the same parts, and a detailed description thereof will be omitted.

More specifically, as shown in FIG. 11, a grating 19 having a function of splitting illumination light is arranged on a surface of a transparent substrate 13 opposite to a surface on which a main pattern 14 and a phase shifter 15 are formed, i.e., on a surface on the illumination light incident side.

Figure 12:
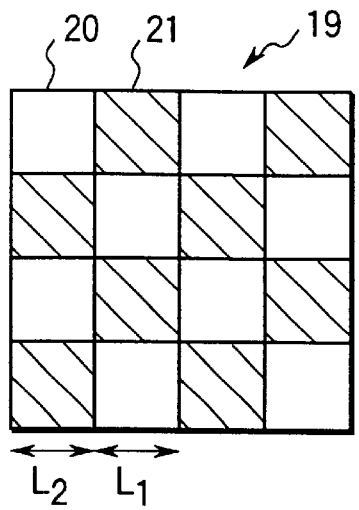
FIG. 12 is a plan view showing the grating pattern of the mask used in the third embodiment.

An example of the pattern of the grating 19 is shown in FIG. 12. In FIG. 12, reference numeral 20 denotes a transparent portion; and 21 denotes a shifter portion for controlling the transmittance and the phase difference.

Figure 13:
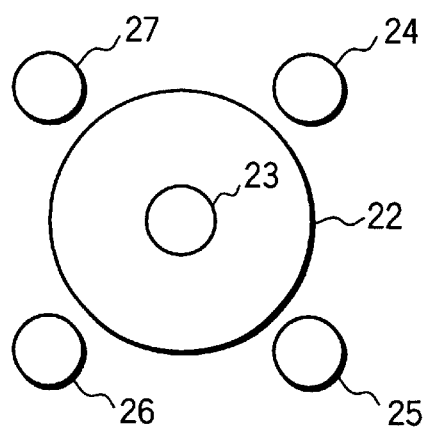
FIG. 13 is a view showing the diffracted light distribution obtained when the grating pattern in FIG. 12 is used.

By properly setting the pitch of the grating 19, the 1st-order diffracted light component can be regarded as four-spot illumination light from the dark field, and the 0th-order diffracted light component can be regarded as an illumination light component from the bright field, as shown in FIG. 13. Reference numeral 22 in FIG. 13 denotes a pupil radius; 23 denotes a bright field illumination light component; and 24 to 27 denotes dark field illumination light components. The splitting rate of the two illumination light components can be adjusted by the transmittance and phase of the diffraction grating.

By illuminating the main pattern 14 and the phase shifter 15 by the 0th-order and 1st-order light components split by the grating 19, the same effect as that obtained when bright field exposure and dark field exposure are simultaneously performed can be attained. That is, a satisfactory pattern free from any residual resist can be formed by one exposure step using one mask 18.

Figure 14:
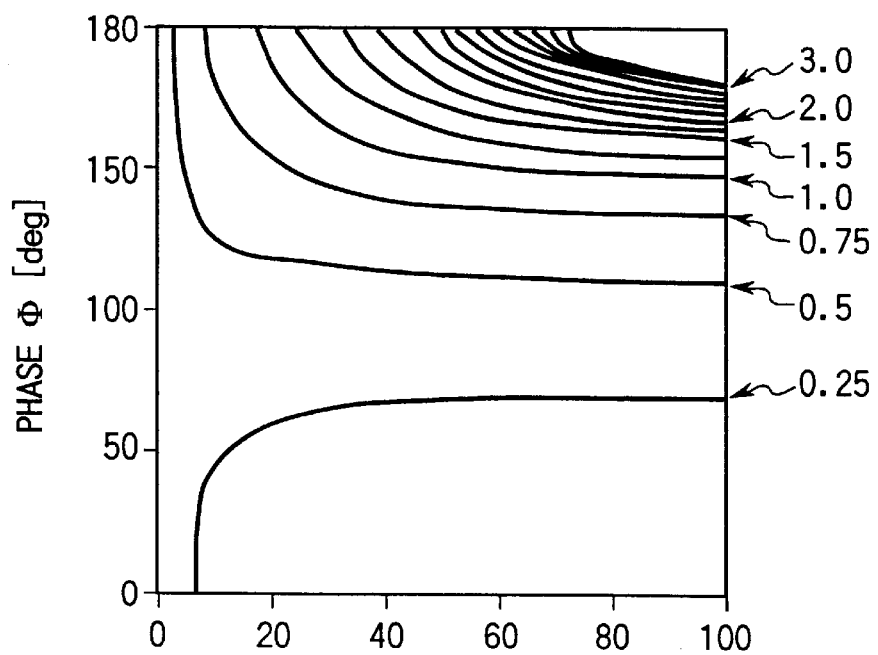
FIG. 14 is a contour graph showing the ratio of the intensity of dark field illumination light to that of bright field illumination light on the basis of the transmittance and the phase difference of the grating pattern.

The pitch of the grating 19 is desirably the maximum size selected from conditions under which the pitch does not depend on changes in ratio of the dark field illumination light intensity to the bright field illumination light intensity. In optimizing the pitch, the phase and transmittance of the grating 19 can be easily controlled when the ratio of the dark field light intensity to the bright field light intensity is about 3 to 5, as shown in FIG. 14.

More specifically, a high intensity ratio is preferable for removing residual resist and increasing the resolution, and is generally desirably 3 or more. However, if the intensity ratio is more than 5, the intensity ratio greatly varies in response to slight variations in phase and transmittance. From this point, a desirable ratio of the dark field light intensity to the bright field light intensity is 3 to 5.

If the transmittance of the grating 19 is 100% for an intensity ratio of 3 to 5, a phase variation ΔΦ for suppressing the variation in intensity ratio to 0.25 can be allowed to 2.45 deg. If the proper exposure dependence on changes in ratio of the dark field light intensity to the bright field light intensity is small, the pattern can be formed even when the phase and transmittance of the diffraction grating slightly deviate from desired values. Therefore, if a two-dimensional diffraction grating having a large pitch is selected from two-dimensional diffraction gratings satisfying these conditions, manufacture is facilitated.

In the third embodiment, a grating having a matrix-like grating pattern with a pitch of about 2 μm was used as the grating 19, and illuminated by normal illumination light with NA=0.5 and σ=0.3 to obtain a desired pattern like the one shown in FIG. 7, similar to the first embodiment.

Accordingly, exposure by bright field illumination and exposure by dark field illumination can be simultaneously performed without using a special projection exposure apparatus having a dark field illumination system, and the same effects as those of the first and second embodiments can be obtained.

In the third embodiment, the grating 19 is formed of the phase-shifting member 21 such as $SiO_2$. However, the grating 19 may be formed by etching one surface of the transparent substrate 13.

The grating 19 need not be integrally arranged on the mask 18. That is, the grating 19 may be formed as a "grating mask" independently of the mask 18, and arranged on the bright field illumination system 4 side of the mask 18.

More specifically, a shifter film made of $SiO_2$ for controlling the transmittance and the phase is formed on the entire surface of a substrate made of silica transparent to exposure light. This shifter film is patterned into a matrix-like grating pattern like the one shown in FIG. 12 by dry etching or the like, thereby forming a grating mask.

At this time, the shifter film need not always be formed, and the grating may be formed by etching the substrate. This grating mask may be bonded to the lower surface of the mask, or set between the mask and the light source while being spaced apart from the mask by a predetermined distance.

(Fourth Embodiment)

The fourth embodiment of the present invention will be described below with reference to FIGS. 15A and 15B.

Figure 15A:
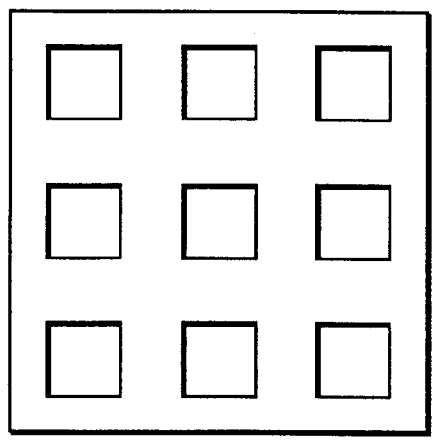
FIGS. 15A and 15B are views, respectively, showing the plan and sectional structures of an mask used in the fourth embodiment.
Figure 15B:
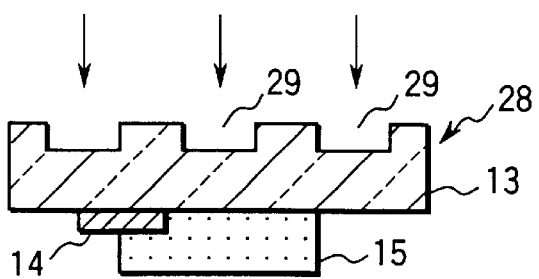

FIGS. 15A and 15B are a plan view and a sectional view, respectively, for explaining the schematic arrangement of an mask 28 used in the fourth embodiment of the present invention. The fourth embodiment employs a grating prepared by laying out contact hole patterns 29 in a matrix.

As shown in FIG. 15A, a plurality of contact hole patterns 29 are formed at a predetermined interval in the row and column directions on a surface of a transparent substrate 13 opposite to a surface on which a main pattern 14 and a phase shifter 15 are formed.

Also in this case, similar to the third embodiment, the beam-splitting mechanism need not be formed on the mask 28 itself, but realized as a grating mask independent from the mask 28 and arranged on the light source side of the mask 28.

In the fourth embodiment, the contact hole patterns 29 were formed at a pitch of 2 μm, and illuminated by normal illumination light with NA=0.5 and σ=0.3 to effectively remove residual resist and obtain a desired pattern like the one shown in FIG. 7, similar to the third embodiment.

More specifically, when normal illumination light 3 is irradiated on the mask 28 through a bright field illumination system 4, the illumination light 3 is diffracted by the patterns 29 formed on the mask 28. Of the diffracted light, the 0th-order and 1st-order diffracted light components respectively function as illumination light components from the bright and dark field illumination systems 4 and 5 in the first embodiment to illuminate the main pattern 14 and the phase shifter 15 formed on the mask 18. Accordingly, even if no dark field illumination system is arranged unlike the first embodiment, residual resist generated in correspondence with a shifter edge 16 can be removed, similar to the first embodiment.

(Fifth Embodiment)

The fifth embodiment of the present invention will be described below with reference to FIGS. 16A to 16C.

In the third and fourth embodiments, the gratings 19 and 29 each having the function of splitting normal illumination light into bright and dark field illumination light components are used to realize bright field illumination and dark field illumination. In the fifth embodiment, an optical element 31 having a function of refracting part of normal illumination light at the same incident angle as that of dark field illumination light is arranged on a mask 30.

Figure 16A:
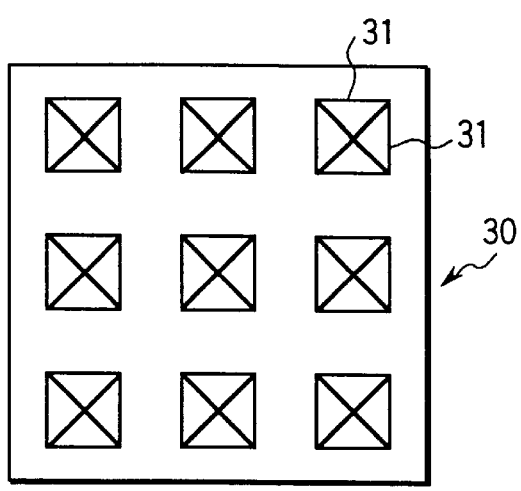
FIGS. 16A to 16C are views, respectively, showing the plan and sectional structures of an mask used in the fifth embodiment.
Figure 16B:
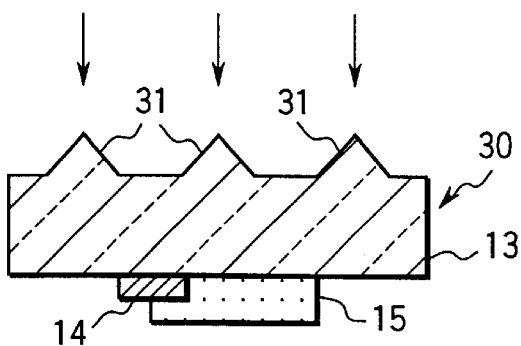
Figure 16C:
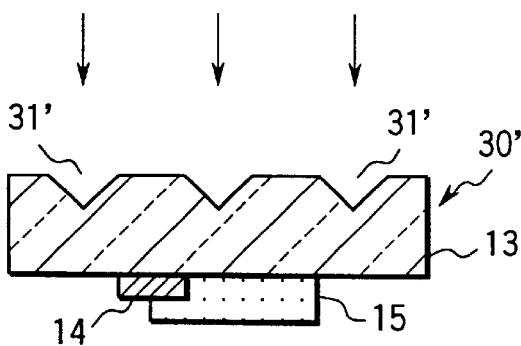

As shown in FIGS. 16A and 16B, a plurality of quadrangular-pyramid-like optical elements 31 are arranged at a predetermined distance in the row and column directions on a surface of a transparent substrate 13 of the mask 30 opposite to a surface on which a main pattern 14 is formed. The optical element 31 may project from the substrate surface 13, as shown in FIG. 16B, or be recessed from the transparent substrate 13, as shown in FIG. 16C.

Also in this case, similar to the third embodiment, the optical element 31 need not be formed on the mask itself, but realized as a mask independent from the mask and arranged on the illumination light source side of the mask.

In the fifth embodiment, the optical elements 31 each having a width and height of about 2 μm are recessed or project from the illumination side at an interval of about 4 μm, and illuminated by normal illumination light with NA=0.5 and σ=0.3. As a result, residual resist could be effectively removed, a desired pattern like the one shown in FIG. 7 could be obtained, similar to the first embodiment.

In the fifth embodiment, the dimension, refraction angle, and layout interval of the optical element are important. To control these sizes, the intensity ratio of dark field illumination to bright field illumination can be properly set, and residual resist generated in correspondence with the shifter edge of the phase shifter can be effectively removed, similar to the first embodiment.

(Sixth Embodiment)

The sixth embodiment of the present invention will be described below with reference to FIGS. 17A to 17C.

Figure 17A:
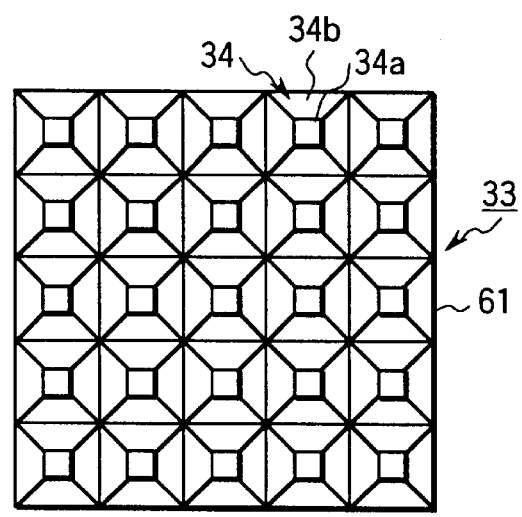
FIGS. 17A to 17C are views, respectively, showing the plan and sectional structures of an mask used in the sixth embodiment.
Figure 17B:
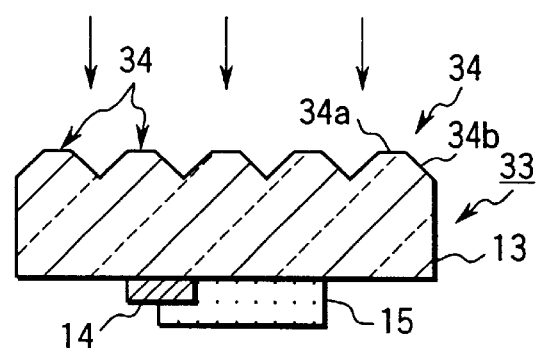

As shown in FIGS. 17A and 17B, an optical element 34 arranged on an mask 33 used in the sixth embodiment corresponds to an element prepared by cutting off the top of the optical element 31 of the fifth embodiment flat.

With this arrangement, light incident on a flat surface 34a at the top of the optical element 34 travels straight to serve as bright field illumination light. Light incident on an inclined surface 34b of the optical element 34 is refracted to serve as dark field illumination light. According to the arrangement of the sixth embodiment, the interval between the optical elements 31 need not be set, unlike the fifth embodiment.

The ratio of the area of the plan surface 34a to the projection area of the inclined surface 34b is important in the arrangement of the sixth embodiment. This ratio determines the intensity ratio of bright field illumination to dark field illumination.

In the sixth embodiment, the area ratio was set to about 1:4, and normal illumination light with NA=0.5 and σ=0.3 was irradiated on the optical element 34. As a result, a desired pattern like the one shown in FIG. 7 was obtained, similar to the first embodiment.

Figure 17C:
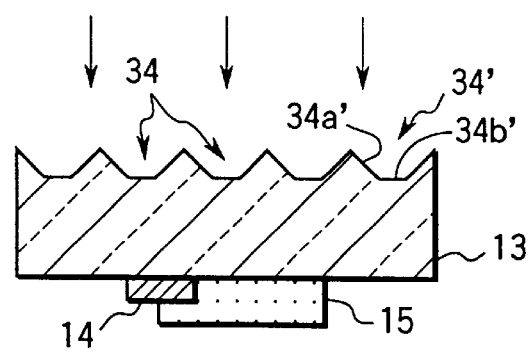

The optical element may project from the substrate surface, as shown in FIG. 17B, or be recessed from the substrate surface, as shown in FIG. 17C.

The present invention is not limited to the above-described embodiments. Although exposure by bright field illumination and exposure by dark field exposure are simultaneously performed in the above embodiments, they may be independently performed.

At this time, exposure by bright field illumination and exposure by dark field illumination can be performed in an arbitrary order, or may be alternately repeatedly performed. The greatest effect can be obtained by the present invention for an isolated pattern, but the present invention can also be applied to another mask having a region where the shifter edge 16 of the phase-shifting member 15 does not contact the main pattern 14 (light-shielding member).

The directions of the mask and the grating 19 or the optical element having a refraction function are set such that they overlap at about 0° or 45° so as to more satisfactorily resolve a desired pattern. The dimension, the illumination conditions, and the like are not limited to those described in the above embodiments, and need only satisfy conditions for obtaining a sufficient effect. In the above embodiments, the beam-splitting mechanism is bonded to the mask. However, a diffraction grating, a quadrangular pyramid, or the like serving as the beam-splitting mechanism can be directly formed on a transparent substrate itself constituting the mask.

Various changes and modifications are deemed to lie within the spirit and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. An exposure apparatus comprising:

an exposure optical system including a phase-shifting mask having a transparent substrate, a light-shielding portion formed on the transparent substrate, and a phase shifter portion formed on the transparent substrate to form a shifter edge with respect to the transparent substrate, to generate bright field illumination light and dark field illumination light which emphasizes the shifter edge to form a bright portion, thereby performing both exposure of a resist by the dark field illumination light and exposure of said resist by bright field illumination light; and exposure control means for controlling exposure energy by the dark field illumination light and exposure energy by the bright field illumination light to remove residual resist generated by influence of the shifter edge of said phase shifter portion.

2. An apparatus according to claim 1, wherein said exposure optical system comprises a dark field illumination system and a bright field illumination system.

3. An apparatus according to claim 1, wherein said exposure optical system has a single illumination light source, and a beam-splitting mechanism for splitting illumination light emitted by said illumination light source into bright and dark field illumination light components, and said exposure control means is an adjustment mechanism arranged in said beam-splitting mechanism to adjust intensities of the bright and dark field illumination light components.

4. An apparatus according to claim 3, wherein said beam-splitting mechanism comprises a grating, and 0th-order and 1st-order diffracted light components obtained by said grating are respectively used as the bright and dark field illumination light components.

5. An apparatus according to claim 4, wherein a pitch of said grating is controlled to control an intensity ratio of the dark field illumination light to the bright field illumination light.

6. An apparatus according to claim 3, wherein said beam-splitting mechanism comprises an optical element having a first optical portion for directing incident illumination light to a direction to serve as dark field illumination, and a second optical portion for directing the incident illumination light to a direction to serve as bright field illumination, and splits the illumination light emitted by said illumination light source into the bright and dark field illumination light components.

7. An apparatus according to claim 6, wherein an intensity ratio of the dark field illumination light component to the bright field illumination light component is controlled by controlling a ratio of a projection area of an incident surface of said first optical portion in an incident direction to a projection area of an incident surface of said second optical portion in the incident direction.

8. An apparatus according to claim 3, wherein said beam-splitting mechanism is integrally arranged on an illumination light source side of said phase-shifting mask.

9. An exposure apparatus according to claim 1, wherein said phase shifting mask further comprises a diffraction grating mechanism formed on said transparent substrate for splitting illumination light into bright and dark field illuminations.

* * * * *